(12) United States Patent
Subramanian et al.

(10) Patent No.: US 6,459,155 B1
(45) Date of Patent: Oct. 1, 2002

(54) DAMASCENE PROCESSING EMPLOYING LOW SI-SION ETCH STOP LAYER/ARC

(75) Inventors: Ramkumar Subramanian; Dawn M. Hopper, both of San Jose; Minh Van Ngo, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/729,528

(22) Filed: Dec. 5, 2000

(51) Int. Cl.[7] .................. H01L 21/4763; H01L 23/48
(52) U.S. Cl. .................. 257/760; 438/624; 438/634; 438/636; 438/724; 257/758
(58) Field of Search .................. 438/622, 624, 438/634, 636, 723, 724; 257/750, 752, 758, 759, 760

(56) References Cited

U.S. PATENT DOCUMENTS

| | | | |
|---|---|---|---|
| 6,008,120 A | * 12/1999 | Lee | 438/634 |
| 6,040,619 A | 3/2000 | Wang et al. | 257/649 |
| 6,114,233 A | 5/2000 | Yeh | 438/622 |
| 6,107,204 A | 8/2000 | Yu et al. | 438/694 |
| 6,153,504 A | * 11/2000 | Shields et al. | 438/613 |
| 6,153,511 A | * 11/2000 | Watatani | 438/623 |
| 6,153,541 A | * 11/2000 | Yao et al. | 438/786 |
| 6,174,803 B1 | * 1/2001 | Harvey | 438/638 |
| 6,184,142 B1 | * 2/2001 | Chung et al. | 438/692 |
| 6,187,663 B1 | * 2/2001 | Yu et al. | 438/624 |
| 6,245,669 B1 | * 6/2001 | Fu et al. | 438/636 |
| 6,326,301 B1 | * 12/2001 | Venkatesan et al. | 438/638 |
| 6,352,921 B1 | * 3/2002 | Han et al. | 438/638 |

* cited by examiner

*Primary Examiner*—T. N. Quach

(57) ABSTRACT

The dimensional accuracy of trench formation and, hence, metal line width, in damascene technology is improved by employing a low Si—SiON etch stop layer/ARC with reduced etch selectivity with respect to the overlying dielectric material but having a reduced extinction coefficient (k). Embodiments include via first-trench last dual damascene techniques employing a low Si—SiON middle etch stop layer/ARC having an extinction coefficient of about −0.3 to about −0.6, e.g., about −0.35, with reduced silicon and increased oxygen vis-à-vis a SiON etch stop layer having an extinction coefficient of about −1.1. Embodiments also include removing about 60% to about 90% of the low Si—SiON etch stop layer/ARC during trench formation, thereby reducing capacitance.

25 Claims, 2 Drawing Sheets

DAMASCENE PROCESSING EMPLOYING LOW SI-SION ETCH STOP LAYER/ARC

TECHNICAL FIELD

The present invention relates to semiconductor devices having accurately dimensioned interconnection patterns. The present invention is particularly applicable to ultra large-scale integrated circuit (ULSI) devices having features in the deep sub-micron regime.

BACKGROUND ART

As integrated circuit geometries continue to plunge into the deep sub-micron regime, it has become increasingly difficult to satisfy the requirements for dimensional accuracy, particularly in integration technology which is considered one of the most demanding aspects of ULSI technology. Demands for ULSI semiconductor wiring require increasingly denser arrays with minimal spacings between and narrower conductive lines. Implementation becomes problematic in manufacturing semiconductor devices having a design rule of about 0.12 micron and under.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometric shrink to sub-micron levels.

A conductive plug filling a via hole is typically formed by depositing an interlayer dielectric on a patterned conductive layer comprising at least one conductive feature, forming an opening through the interlayer dielectric by conventional photolithographic and etching techniques, and filling the opening with a conductive material. The excess conductive material or overburden on the surface of the interlayer dielectric is typically removed by chemical-mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

Copper (Cu) and Cu alloys have received considerable attention as candidates for replacing aluminum (Al) in interconnect metallizations. Cu is relatively inexpensive, easy to process, and has a lower resistively than Al. In addition, Cu has improved electrical properties vis-à-vis tungsten (W), making Cu a desirable metal for use as a conductive plug as well as conductive wiring. However, due to Cu diffusion through interlayer dielectric materials, such as silicon dioxide, Cu interconnect structures must be encapsulated by a diffusion barrier layer. Typical diffusion barrier materials include tantalum (Ta), tantalum nitride (TaN), titanium nitride (TiN), titanium-tungsten (TiW), Tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the interlayer dielectric, but includes interfaces with other metals as well.

Cu interconnect technology, by and large, has been implemented employing damascene techniques, wherein a first dielectric layer, such as a silicon oxide layer, e.g., derived from tetraethyl orthosilicate (TEOS) or silane, or a low dielectric constant material, i.e., a material having a dielectric constant of no greater than 4 (with a dielectric constant of 1 representing a vacuum), is formed over an underlying pattern having a capping layer thereon, e.g., a Cu or Cu alloy pattern with a silicon nitride capping layer. A barrier layer and optional seedlayer are then deposited, followed by Cu deposition, as by electro-deposition or electroless deposition. As employed throughout this disclosure, the symbol Cu is intended to encompass high purity elemental copper as well as Cu-based alloys, such as Cu alloys containing minor amounts of tin, zinc, manganese, titanium, germanium, zirconium, strontium, palladium, magnesium, chromium and tantalum.

In implementing dual damascene techniques wherein the via is formed before forming the trench (via first-trench last), an etch stop layer, such as silicon nitride or silicon oxynitride, is deposited on the first dielectric layer. A second dielectric layer is then deposited on the etch stop layer. The etch stop layer is chosen for its high selectivity with respect to the overlying second dielectric layer. A photomask is then formed over the second dielectric layer, and anisotropic etching is conducted to form a via opening through the second dielectric layer, etch stop layer and first dielectric layer to the underlying conductive feature. Subsequently, the photomask for the via opening is removed and a photomask for a trench opening is formed overlying the second dielectric layer. Anisotropic etching is then conducted to form a trench, having a diameter wider than that of the via hole, stopping on the middle etch stop layer.

As miniaturization proceeds apace with an attendant shrinkage in the size of metal lines, e.g., metal lines having a width of about 0.2 micron and under, it becomes increasingly difficult to maintain the dimensional accuracy of the metal lines, particularly when implementing dual damascene techniques. Accordingly, there exists a need for interconnection methodology enabling the formation of metal features, such as metal lines, with high dimensional accuracy. There exists a particular need for dual damascene methodology enabling the formation of accurately dimensioned metal lines having a width of about 0.3 micron and under, e.g., about 0.2 microns and under.

SUMMARY OF THE INVENTION

An advantage of the present invention is a semiconductor device having an interconnection pattern with high dimensional accuracy.

Another advantage of the present invention is a method of manufacturing a semiconductor device comprising an interconnection pattern with accurately dimensioned metal lines.

Additional advantages and features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a silicon oxynitride etch stop layer/anti-reflective coating (ARC) on a first dielectric layer, the silicon oxynitride etch stop layer/ARC having an extinction coefficient (k) of about −0.3 to about −0.6; forming a second dielectric layer over the silicon oxynitride etch stop layer/ARC; and etching an opening in the second dielectric layer and into a portion of the silicon oxynitride etch stop layer/ARC stopping before reaching the first dielectric layer.

Embodiments of the present invention comprise via first-trench last damascene techniques comprising forming the first dielectric layer over an underlying metal feature with a capping layer thereon, such as silicon nitride, depositing a low silicon-silicon oxynitride etch stop layer/ARC having an extinction coefficient of about −0.3 to about −0.4, depositing a second dielectric layer, such as a silicon oxide, on the low silicon-silicon oxynitride etch stop layer/ARC, and forming a via hole through the second dielectric layer, low silicon-silicon oxynitride etch stop layer/ARC and first dielectric layer to the underlying metal feature. A trench is then formed in the second dielectric layer stopping on but removing about 60% to about 90% of the thickness of the low silicon-silicon oxynitride etch stop layer/ARC, thereby reducing capacitance. A metal, such as Cu, is then deposited to simultaneously fill the via opening and communicating trench. In implementing Cu integration technology, a barrier layer is typically deposited first with or without a seed layer followed by deposition of the Cu. Subsequently, CMP is implemented and a capping layer, such as silicon nitride, is deposited. Embodiments of the present invention include depositing the low silicon-silicon oxynitride etch stop layer/ARC by chemical vapor deposition at an increased $N_2O_2$ flow rate such that the deposited low silicon oxynitride etch stop layer/ARC has an oxygen content of about 10 at. % to about 15 at. % greater, and a silicon content of about 10 at. % to about 50 at. % less, than that of a conventional silicon oxynitride etch stop layer, such as a conventional silicon oxynitride etch stop layer having an extinction coefficient (k) of about −1.1.

Another aspect of the present invention is a semiconductor device comprising an interconnection pattern, the interconnection pattern comprising: a metal line, having first and second side surfaces and a first width, in a trench, and a silicon oxynitride etch stop layer/anti-reflective coating (ARC) in the trench, the silicon oxynitride etch stop layer/ARC having an extinction coefficient (k) of about −0.3 to about −0.6.

Embodiments of the present invention include a semiconductor device having an interconnection pattern comprising a dual damascene structure wherein the silicon oxynitride etch stop layer/ARC in the trench extending between the side surfaces has a thickness of about 60% to about 90% of the thickness of the silicon oxynitride etch stop layer/ARC extending from the side surfaces away from the trench.

Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and descriptions are to regarding as illustrative in nature and not as restrictive.

BRIEF DESCRIPTION OF THE DRAWINGS

In FIGS. 1 and 2, like features are denoted by like reference numerals.

DESCRIPTION OF THE INVENTION

Figure 1:
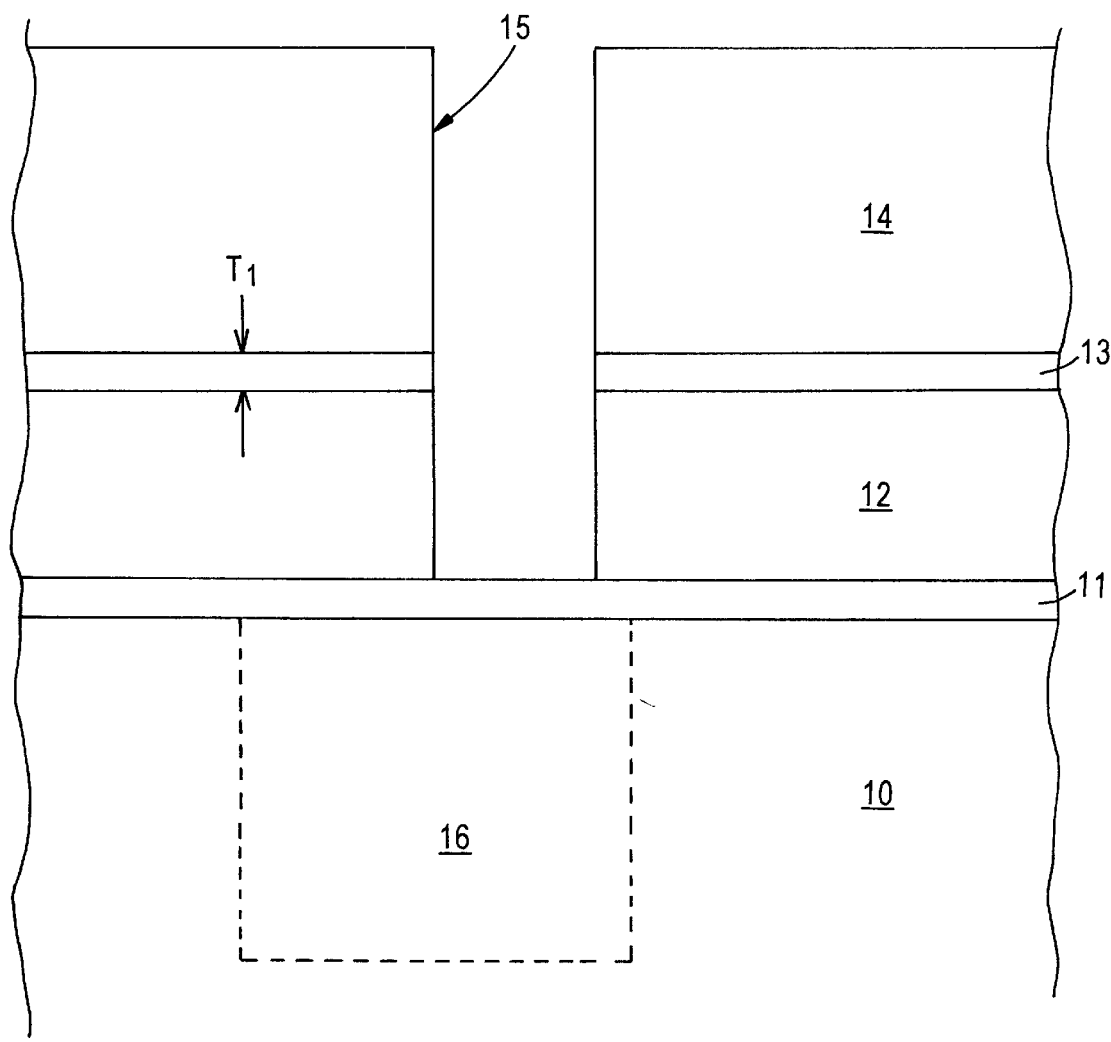
FIGS. 1 and 2 schematically illustrate sequential phases of a method in accordance with an embodiment of the present invention, with FIG. 2 schematically illustrating the resulting interconnection pattern.

The present invention provides methodology enabling the formation of semiconductor devices having interconnection patterns with improved dimensional accuracy, such as accurately dimensioned metal lines, e.g., Cu lines, having a width of about 0.3 micron and under, e.g., about 0.2 micron and under. This objective is achieved by strategically manipulating the composition of a silicon oxynitride etch stop layer to actually reduce its effectiveness as an etch stop layer but enhancing its performance as an ARC by lowering its (k) value. Embodiments of the present invention, therefore, sacrifice the etch stopping capability of a silicon oxynitride layer but improve photolithic patterning of the opening, such as a trench, by reducing the reflectance of the silicon oxynitride layer, as by reducing its extinction coefficient (k).

The present invention has particular applicability in via first-trench last dual damascene technology, employing a silicon oxynitride middle etch stop layer. Silicon oxynitride conventionally employed as an etch stop layer typically has an extinction coefficient (k) of about −0.7 to about −1.1, e.g., about −1.1. In accordance with conventional practices, the silicon oxynitride middle etch stop layer is deposited at a suitable thickness, such as about 200 Å to about 800 Å. Such a conventional silicon oxynitride etch stop layer has high etch selectivity with respect to the overlying dielectric layer, such as a silicon oxide layer, e.g., silicon oxide derived from TEOS or silane. Consequently, only about 20% of the silicon oxynitride etch stop layer is removed when etching to form the trench. In other words, the thickness of the originally deposited conventional silicon oxynitride etch stop layer is reduced by about 20%.

In accordance with embodiments of the present invention, the composition of the silicon oxynitride layer is adjusted so that it can perform with high effectiveness as an ARC by increasing its oxygen content, as by about 10 to about 15 at. %, and reducing the silicon content, as by about 10 to about 15 at. %, with respect to silicon oxynitride having an extinction coefficient of about −1.1. Specifically, a conventional silicon oxynitride etch stop layer having an extinction coefficient of about −1.1 are typically formed by chemical vapor deposition employing a $SiO_2$ flow rate of about 50 to about 75 sccm, e.g., about 65 sccm, a $N_2O_2$ flow rate of about 10 to about 20 sccm and a $N_2$ flow rate of about 2,000 to about 5,000. In accordance with embodiments of the present invention, the silicon oxynitride layer is deposited by chemical vapor deposition employing a $SiO_2$ flow rate of about 50 to about 75 sccm, e.g., about 65 sccm, but a higher $N_2O_2$ flow rate of about 50 to about 75 sccm, e.g., about 65 sccm, and a $N_2$ flow rate of about 2,000 to about 5,000 sccm. The resulting silicon oxynitride layer typically has an extinction coefficient (k) of about −0.3 to about −0.6, e.g., about −0.3 to about −0.4, notably about −0.35.

It was surprisingly found that the etch selectivity of the silicon oxynitride etch stop layer can be sacrificed without adverse impact on dual damascene techniques while, at the same time, its reflectance increased such that it can serve not only as an etch stop layer but also effectively as an ARC, thereby improving the dimensional accuracy of the trench formed thereover. Thus, embodiments of the present invention deviate from conventional technology by sacrificing the etch stopping ability of a middle silicon oxynitride etch stop layer so that it can function effectively as an ARC thereby improving the dimensional accuracy of line widths.

In implementing damascene technology utilizing the silicon-low silicon oxynitride etch stop layer/ARC of the present invention, about 60 to about 90%, e.g., about 80%, of the silicon oxynitride layer is removed when etching the overlying trench. However, a sufficient amount of the silicon oxynitride layer remains such that a trench can be formed, as over a via opening, with improved dimensional accuracy vis-à-vis conventional practices employing a silicon oxynitride etch stop layer having an extinction coefficient of about −1.1.

Figure 2:
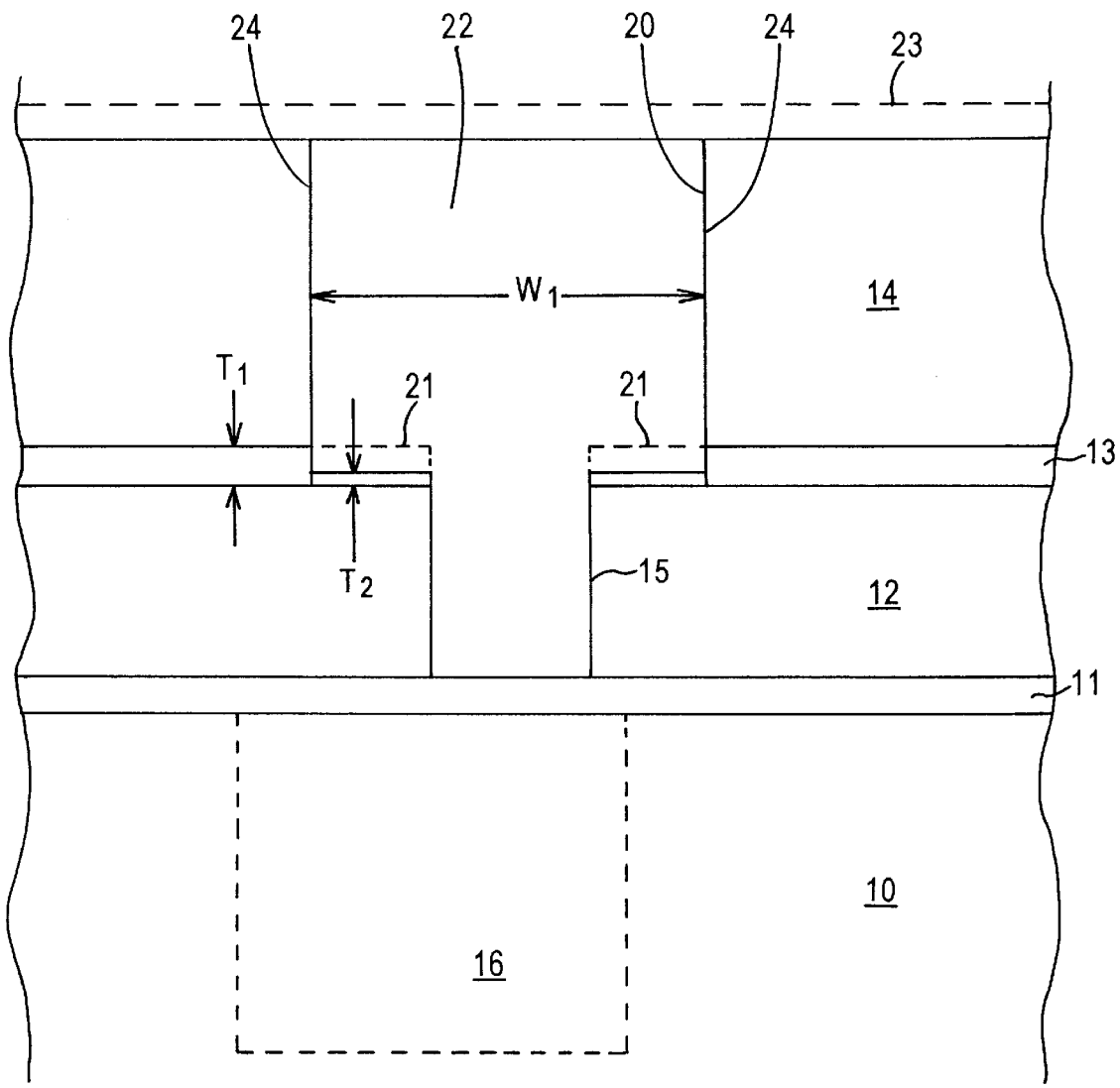

An embodiment of the present invention is schematically illustrated in FIGS. 1 and 2. Adverting to FIG. 1, a first dielectric layer 12 is formed over an underlying layer 10 having a metal feature 16, such as an underlying metal line, and a capping layer 11, such as silicon nitride, thereon. A low silicon oxynitride etch stop layer/ARC 13 is then deposited on first dielectric layer 12 at a suitable thickness $T_i$, such as about 200 Å to about 800 Å, e.g., about 500 Å. Silicon oxynitride layer 13 typically has an extinction coefficient of about −0.3 to about −0.6, e.g., about −0.35. Subsequently, dielectric layer 14, such as a silicon oxide layer, is deposited on silicon oxynitride layer 13. Via opening 15 is then formed in a conventional manner, as by forming a photoresist mask over layer dielectric 14 and anisotropically etching. The etch chemistry employed is such that there is virtually no selectivity between the etched layers. Via opening 15 is formed through second dielectric 14, silicon oxynitride layer 13 and first dielectric layer 12 stopping on barrier metal layer 11.

Subsequently, adverting to FIG. 2, trench opening 20 is formed through second dielectric layer 14 in communication with via opening 15. During etching, there is sufficient selectivity between silicon oxynitride layer 13 and dielectric layer 14 although etch selectivity is reduced vis-à-vis conventional silicon oxynitride having an extinction coefficient of about −1.1. However, silicon oxynitride layer 12, having a significantly reduced extinction coefficient (k), e.g., about −0.35, enables the formation of the trench opening 20 with accurately formed vertical side surfaces 24 and an accurately dimensioned width $W_1$ vis-à-vis conventional practices employing a silicon oxynitride etch stop layer 13 having an extinction coefficient of about −1.1. The poor etch selectivity of silicon oxynitride etch stop layer/ARC. 13 results in the reduction of the first thickness $T_1$ to a second thickness $T_2$ of about 60% to about 90%, e.g., about 80, of the first thickness Ti. However, the reduction in etch selectivity of silicon oxynitride layer 13 does not adversely impact formation of the dual damascene structure, but does significantly improve the dimensional accuracy of the side surfaces 24 of trench opening 20. Subsequently, processing is conducted in a conventional manner, as by depositing metal 22 filling the via opening 50 and trench 20, forming an overburden (not shown), conducting CMP, and then depositing a capping layer 23 (shown in phantom), typically silicon nitride.

The present invention advantageously enables implementation of damascene technology in the deep sub-micron regime, e.g., for metal lines having a width of about 0.3 micron and under, e.g., about 0.2 micron and under, including Cu damascene technology, particularly via first-trench last dual damascene technology. In implementing the present invention, conductive metals can be employed and any of various dielectric materials, can be employed for the dielectric layers. Such dielectric layers include any of various forms of silicon oxide as well as low dielectric constant materials, such as polymers and various organic, carbon-containing materials having a dielectric constant less than about 4, e.g., less than about 3.

The present invention enjoys industrial applicability in manufacturing various types of semiconductor devices. The present invention is particularly applicable in manufacturing semiconductor devices with high circuit speeds having design features in the deep sub-micron regime.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:
    forming a silicon oxynitride etch stop layer/anti-reflective coating (ARC) at a first thickness on a first dielectric layer, the silicon oxynitride having an extinction coefficient (k) of about −0.3 to about −0.6;
    forming a second dielectric layer over the silicon oxynitride etch stop layer/ARC; and
    etching an opening in the second dielectric layer and into a portion of the silicon oxynitride etch stop layer/ARC, to reduce the first thickness to a second thickness of about 60% to about 90% of the first thickness, stopping before reaching the first dielectric layer.

2. The method according to claim 1, wherein the second dielectric layer comprises a silicon oxide.

3. The method according to claim 2, wherein the opening is a trench.

4. The method according to claim 3, comprising forming a dual damascene opening by:
    etching a via opening through the second dielectric layer before etching to form the trench.

5. The method according to claim 4, comprising filling the via opening and trench opening with a metal.

6. The method according to claim 5, comprising filling the via opening and trench opening with copper (Cu) or a Cu alloy.

7. The method according to claim 4, comprising:
    depositing the silicon oxynitride etch stop layer/ARC at a first thickness; and
    etching to form the trench opening and reduce the first thickness to a second thickness of about 60% to about 90% of the first thickness.

8. The method according to claim 7, comprising depositing the silicon oxynitride etch stop layer/ARC at a thickness of about 200 Å to about 800 Å.

9. The method according to claim 7, wherein the silicon oxynitride etch stop layer/ARC has an extinction coefficient of about −0.3 to about −0.4.

10. The method according to claim 1, comprising filling the opening with a metal.

11. The method according to claim 10, wherein the opening is a trench, the method comprising filling the opening with copper (Cu) or a Cu alloy.

12. The method according to claim 1, comprising depositing the silicon oxynitride etch stop layer/ARC by chemical vapor deposition at a:
   $SiO_2$ flow rate of about 50 to about 75 sccm;
   $N_2O_2$ flow rate of about 50 to about 75 sccm; and
   $N_2$ flow rate of about 2,000 to about 5,000 sccm.

13. The method according to claim 1, comprising forming the first dielectric layer on a capping layer for an underlying metal pattern.

14. The method according to claim 13, wherein the capping layer comprises silicon nitride.

15. A semiconductor device comprising an interconnection pattern, the interconnection pattern comprising:
   a metal line, having first and second side surfaces and a first width, in a trench;
   a first dielectric layer;
   a silicon oxynitride etch stop layer/anti-reflective coating (ARC) on the first dielectric layer and in the trench, the silicon oxynitride ARC/etch stop layer having an extinction coefficient of about −0.3 to about −0.6
   a second dielectric layer on the silicon oxynitride etch stop layer/ARC; and
   a via, having a second width narrower than the first width, extending through the silicon oxynitride etch stop layer/ARC and through the first dielectric layer; wherein:
      the metal line in the trench is in communication with the via; and
      the silicon oxynitride etch stop layer/ARC in the trench between the side surfaces has a thickness of about 60% to about 90% of the thickness of the silicon oxynitride etch stop layer/ARC extending from the side surfaces away from the trench.

16. The semiconductor device according to claim 15, wherein the thickness of the silicon oxynitride etch stop layer/ARC extending away from the trench is about 200 Å to about 800 Å.

17. The semiconductor device according to claim 15, wherein the second dielectric layer comprises a silicon oxide.

18. The semiconductor device according to claim 15, wherein the first dielectric layer is on a capping layer for a underlying metal pattern.

19. The semiconductor device according to claim 15, wherein the metal is copper (Cu) or a Cu alloy.

20. A method of manufacturing a semiconductor device, the method comprising:
   depositing a silicon oxynitride etch stop layer/anti-reflective coating (ARC) on a first dielectric layer, the silicon oxynitride having an extinction coefficient (k) of about −0.3 to about −0.6 by chemical vapor deposition at a:
      $SiO_2$ flow rate of about 50 to about 75 sccm;
      $N_2O_2$ flow rate of about 50 to about 75 sccm; and
      $N_2$ flow rate of about 2,000 to about 5,000 sccm;
   forming a second dielectric layer over the silicon oxynitride etch stop layer/ ARC; and
   etching an opening in the second dielectric layer and into a portion of the silicon oxynitride etch stop layer/ARC stopping before reaching the first dielectric layer.

21. The method according claim 20, wherein the second dielectric layer comprises a silicon oxide.

22. The method according to claim 21, comprising:
   a depositing the silicon oxynitride etch stop layer/ARC at a first thickness; and
   etching to form the opening and reduce the first thickness to a second thickness of about 60% to about 90% of the first thickness.

23. The method according to claim 20, comprising forming a dual damascene opening by:
   etching a via opening through the second dielectric layer before etching to form the trench.

24. The method according to claim 23, comprising filling the via opening and trench opening with copper (Cu) or a Cu alloy.

25. The method according to claim 20, wherein the silicon oxynitride etch stop layer/ARC has an extinction coefficient of about −0.3 to about −0.4.

* * * * *